United States Patent
Corrion et al.

(10) Patent No.: US 9,142,626 B1
(45) Date of Patent: Sep. 22, 2015

(54) STEPPED FIELD PLATE WIDE BANDGAP FIELD-EFFECT TRANSISTOR AND METHOD

(71) Applicant: HRL LABORATORIES, LLC., Malibu, CA (US)

(72) Inventors: Andrea Corrion, Oak Park, CA (US); Keisuke Shinohara, Thousand Oaks, CA (US); Miroslav Micovic, Thousand Oaks, CA (US); Rongming Chu, Newbury Park, CA (US); David F. Brown, Woodland Hills, CA (US); Alexandros D. Margomenos, Pasadena, CA (US); Shawn D. Burnham, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 90 days.

(21) Appl. No.: 14/014,915

(22) Filed: Aug. 30, 2013

Related U.S. Application Data

(60) Provisional application No. 61/814,981, filed on Apr. 23, 2013.

(51) Int. Cl.
H01L 29/40 (2006.01)
H01L 29/66 (2006.01)
H01L 29/20 (2006.01)

(52) U.S. Cl.
CPC .......... *H01L 29/402* (2013.01); *H01L 29/2003* (2013.01); *H01L 29/66462* (2013.01)

(58) Field of Classification Search
None
See application file for complete search history.

(56) References Cited

U.S. PATENT DOCUMENTS

| 7,501,669 | B2 | 3/2009 | Parikh et al. | |
| 2007/0267655 | A1* | 11/2007 | Endoh et al. | 257/194 |
| 2009/0267116 | A1 | 10/2009 | Wu et al. | |
| 2011/0049526 | A1* | 3/2011 | Chu et al. | 257/76 |
| 2014/0097471 | A1* | 4/2014 | Briere | 257/194 |

OTHER PUBLICATIONS

Y.F. Wu et al., "30-W/mm GaN HEMTs by Field Plate Optimization", IEEE Electron Device Letters, vol. 25, No. 3 (2004).
Saito et al., "High Breakdown Voltage AlGaN—GaN Power-HEMT Design and High Current Density Switching Behavior", IEEE Transactions on Electronic Devices, vol. 50, No. 12 (2003).
Y. Dora et al., "High Breakdown Voltage Achieved on AlGaN/GaN HEMTs With Integrated Slant Field Plates", IEEE Electron Device Letters, vol. 27, No. 9 (2006).
H. Xing et al., "High Breakdown Voltage AlGaN—GaN HEMTs Achieved by Multiple Field Plates", IEEE Electron Device Letters, vol. 25, No. 4 (2004).
From U.S. Appl. No. 14/014,915 Applications and Office Actions.
From U.S. Appl. No. 14/014,915: Restriction Requirement mailed on Mar. 18, 2015 (non publication requested).

\* cited by examiner

*Primary Examiner* — Khaja Ahmad
(74) *Attorney, Agent, or Firm* — Ladas & Parry

(57) ABSTRACT

A method of making a stepped field gate for an FET including forming a first passivation layer on a barrier layer, defining a first field plate by using electron beam (EB) lithography and by depositing a first negative EB resist, forming a second passivation layer over first negative EB resist and the first passivation layer, planarizing the first negative EB resist and the second passivation layer, defining a second field plate by using EB lithography and by depositing a second negative EB resist connected to the first negative EB resist, forming a third passivation layer over second negative EB resist and the second passivation layer, planarizing the second negative EB resist and the third passivation layer, removing the first and second negative EB resist, and forming a stepped field gate by using lithography and plating in a void left by the removed first and second negative EB resist.

15 Claims, 5 Drawing Sheets

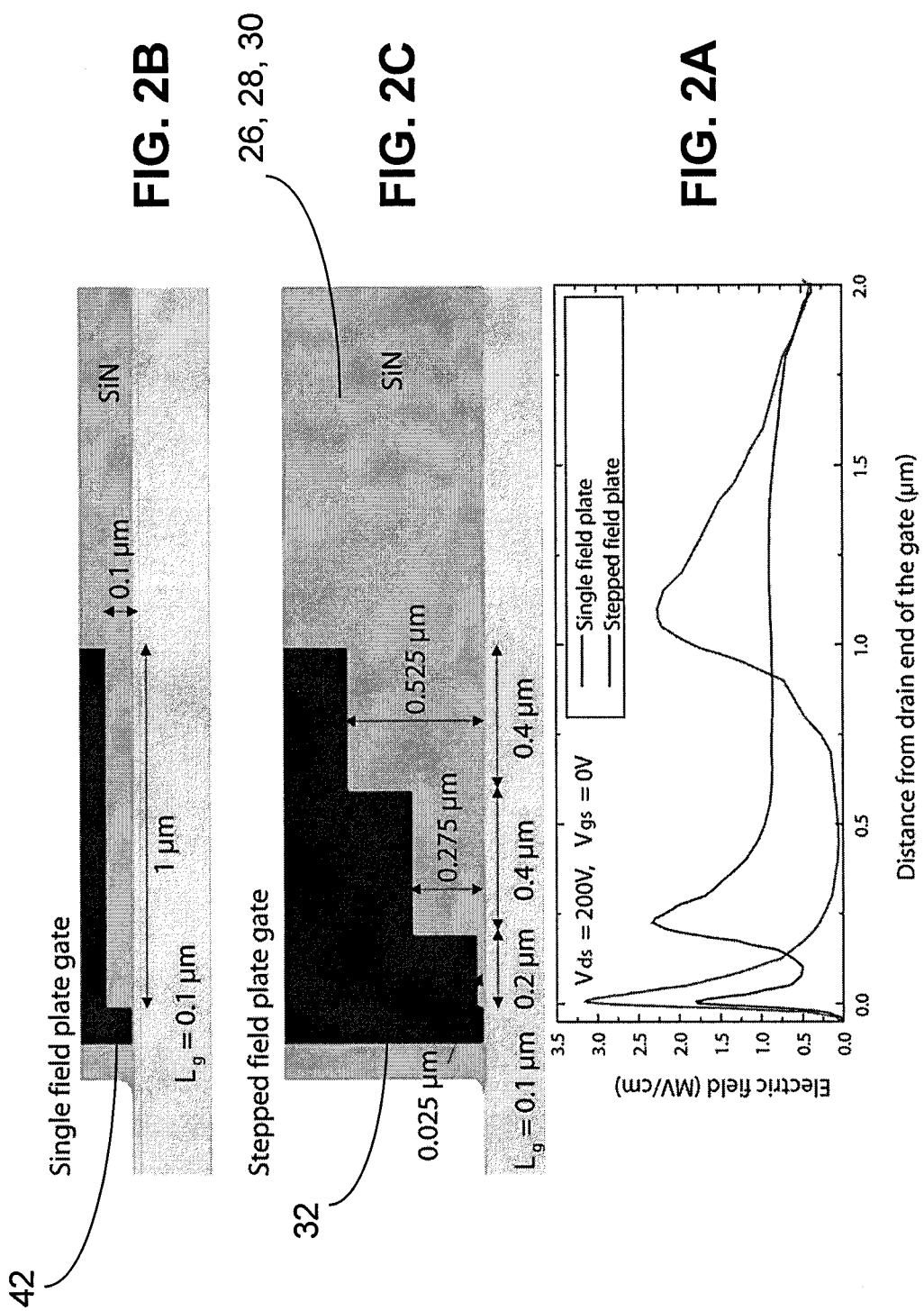

STEPPED FIELD PLATE WIDE BANDGAP FIELD-EFFECT TRANSISTOR AND METHOD

CROSS REFERENCE TO RELATED APPLICATIONS

This application is related to and claims the benefit of U.S. Provisional Application No. 61/814,981, filed Apr. 23, 2013, which is incorporated herein as though set forth in full.

STATEMENT REGARDING FEDERAL FUNDING

This invention was made under U.S. Government contract DARPA FA8650-11-C-7181. The U.S. Government has certain rights in this invention.

TECHNICAL FIELD

This disclosure relates to field plates for transistors, and in particular to stepped field plates.

BACKGROUND

It is well-known that a peak in the electric field at the drain edge of the gate contact can limit the breakdown voltage of field effect transistors (FETs). In GaN FETs, the high electric fields in this region also commonly result in electron trapping at surface states and/or in the buffer, barrier, or passivation layers of the device, resulting in a virtual gate and reducing the on-state current of the device during high-voltage dynamic operation (known as "current collapse" or increased dynamic on-resistance). These issues can be mitigated through the use of field plates, which distribute the electric field over a larger area in the gate-drain region of the device, therefore reducing the peak field intensity.

In the prior art high-voltage GaN devices have typically utilized either a gate with a single field plate or multiple gate- or source-connected field plates separated by supporting dielectric layers, requiring multiple metallization steps during processing. The prior art also includes conventional single field-plate GaN FETs, multiple field-plate GaN FETs, and slant gate FETs.

Y. F. Wu et al. describe in "30-W/mm GaN HEMTs by Field Plate Optimization", IEEE Electron Device Letters, Vol. 25, No. 3 (2004), a single gate-connected field-plate FET. The disadvantages of this approach include a non-optimum electric field profile due to having only a single field plate, a requirement for multiple metallization steps, and a non-plated gate.

Saito et al. describe in "High Breakdown Voltage AlGaN—GaN Power-HEMT Design and High Current Density Switching Behavior", IEEE Transactions on Electronic Devices, Vol. 50, No. 12 (2003) a single source-connected field plate FET. Field plate design and optimization are limited in this approach due to the single field-plate and discontinuity between gate and field-plate, resulting in a non-optimal electric field profile.

Y. Dora et al. describe in "High Breakdown Voltage Achieved on AlGaN/GaN HEMTs With Integrated Slant Field Plates", IEEE Electron Device Letters, Vol. 27, No. 9 (2006) a slanted gate field plate to reduce the peak electric field in the device. The disadvantages of this approach include a symmetric gate profile, which increases parasitic Cgs and limits the source-gate spacing, and poor process control over slant gate angle and gate length.

H. Xing et al. describe in "High Breakdown Voltage AlGaN—GaN HEMTs Achieved by Multiple Field Plates", IEEE Electron Device Letters, Vol. 25, No. 4 (2004) a multiple gate-connected field plate structure. The disadvantages of this approach include separation between the field plates by supporting dielectric layers, which limits field plate design and results in non-optimum electric field profile, multiple metallization steps, and non-plated gate and field plates.

Wu et al. describe in "Wide bandgap transistors with multiple field plates", U.S. Published Patent Application 2009/0267116 several multiple-field-plate GaN FET designs with gate and source-connected field plates separated by supporting dielectric layers. The disadvantages of these approaches include a separation between the field plates by supporting dielectric layers, which limits field plate design and results in non-optimum electric field profile, multiple metallization steps, and non-plated gate and field plates.

Parikh et al. describe in "Wide bandgap transistor devices with field plates" U.S. Pat. No. 7,501,669 issued Mar. 10, 2009, a stepped gate field-plate structure, as shown in FIG. 7 of the Patent. However Parikh does not describe a method of fabrication.

What is needed is a stepped field plate for a field-effect transistor and method of making the stepped field plate that does not have the disadvantages of the prior art. The embodiments of the present disclosure answer these and other needs.

SUMMARY

In a first embodiment disclosed herein, a method of making a stepped field-plate gate field effect transistor comprises forming a first passivation layer on a barrier layer, defining a first field plate by using electron beam lithography and by depositing a first negative electron beam resist, forming a second passivation layer over first negative electron beam resist and the first passivation layer, planarizing the first negative electron beam resist and the second passivation layer, defining a second field plate by using electron beam lithography and by depositing a second negative electron beam resist, the second negative electron beam resist connected to the first negative electron beam resist, forming a third passivation layer over second negative electron beam resist and the second passivation layer, planarizing the second negative electron beam resist and the third passivation layer, removing the first negative electron beam resist and the second negative electron beam resist, and forming a stepped field gate by using lithography and plating, the stepped field gate having a first and second field plate filling a void left by the removed first and second negative electron beam resist and having a third field plate connected to the second field plate and extending over the third passivation layer, wherein the first, second, and third field plates are one structure.

In another embodiment disclosed herein, a method of making a stepped field-plate gate field effect transistor comprises growing a buffer layer on a substrate, a channel layer on the buffer layer, and a barrier layer on the channel layer, forming first and second ohmic contacts to the channel layer for a source and a drain, forming a first passivation layer on the barrier layer and the ohmic contacts, etching portions of the first passivation layer, the first and second ohmic contacts, the channel layer and the buffer layer to form a mesa for device isolation, depositing resist and forming an opening in the resist to define a gate foot, defining a first field plate in the resist by using electron beam lithography and by depositing a first negative electron beam resist, forming a second passivation layer over first negative electron beam resist and the first passivation layer, planarizing the first negative electron beam resist and the second passivation layer, defining a second field plate by using electron beam lithography and by depositing a second negative electron beam resist, the second negative electron beam resist connected to the first negative electron beam resist, forming a third passivation layer over second negative electron beam resist and the second passivation layer, planarizing the second negative electron beam resist and the third passivation layer, removing the first negative electron beam resist and the second negative electron beam resist, depositing a seed layer by atomic layer deposition (ALD), forming a stepped field gate by using lithography and plating, the stepped field gate having a first and second field plate filling in a volume left by the removed first and second negative electron beam resist and having a third field plate connected to the second field plate and extending over the third passivation layer, etching the first, second and third passivation layers to expose the first and second ohmic contacts and depositing a third ohmic contact on the first ohmic contact, and a fourth ohmic contact on the second ohmic contact, and depositing overlay metal on the third and fourth contacts to form a source and a drain contact, respectively.

In still another embodiment disclosed herein, a stepped field-plate gate field effect transistor comprises a buffer layer on a substrate, a channel layer on the buffer layer, and a barrier layer on the channel layer, a passivation layer over the barrier layer, the passivation layer having a stepped opening with steps extending upward from the barrier layer, a seed layer coating the stepped opening, and a stepped field gate plated in the stepped opening and extending above the opening and over at least a part of the passivation layer.

In still yet another embodiment disclosed herein, a method of making a stepped field-plate gate field effect transistor comprises forming a first passivation layer on a barrier layer, defining a first field plate by using lithography and by depositing a first resist, forming a second passivation layer over the first resist and the first passivation layer, planarizing the first resist and the second passivation layer, defining a second field plate by using lithography and by depositing a second resist, the second resist connected to the first resist, forming a third passivation layer over second resist and the second passivation layer, planarizing the second resist and the third passivation layer, removing the first and second resist, and forming a stepped field gate by using lithography and plating, the stepped field gate having a first and second field plate filling a void left by the removed first and second resist and having a third field plate connected to the second field plate and extending over the third passivation layer, wherein the first, second, and third field plates are one structure.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 2A shows the results for an electric field simulation in the GaN channel for a single field-plate FET shown in FIG. 2B in accordance with the prior art and the stepped multiple field-plate FET shown in FIG. 2C in accordance with the present disclosure;

DETAILED DESCRIPTION

Figure 1A:
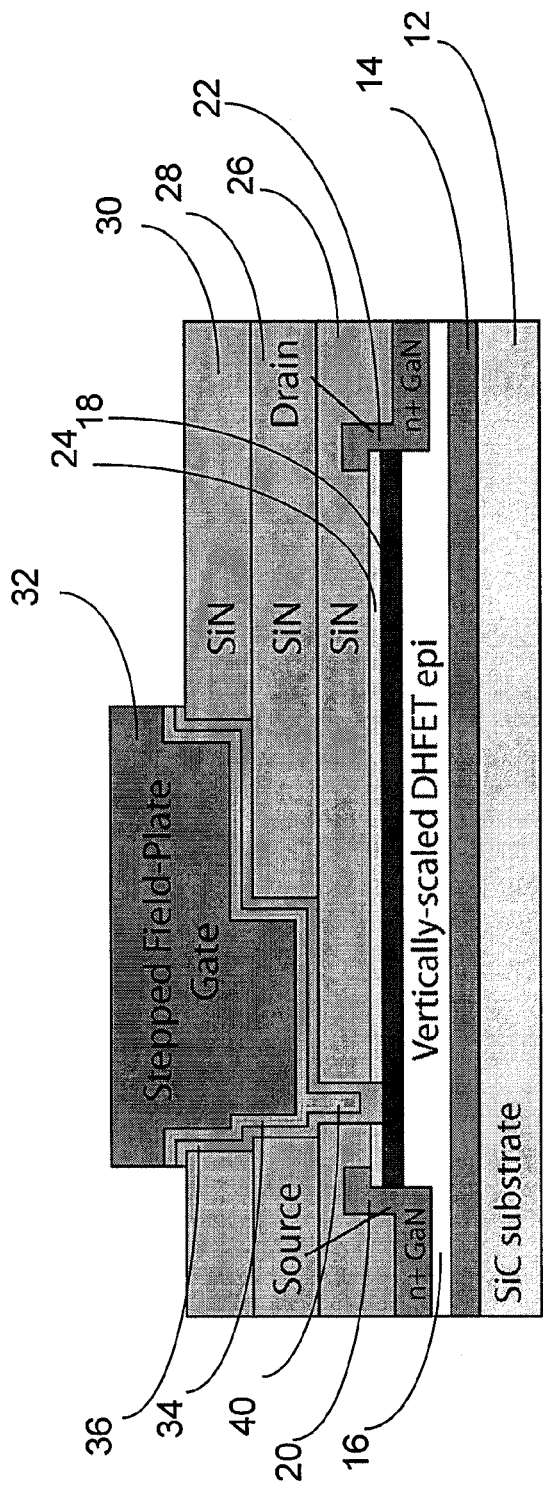
FIG. 1A shows a cross-sectional schematic of a multiple stepped field-plate GaN FET in accordance with the present disclosure.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

This disclosure describes a method of fabricating a stepped field plate gate on a GaN heterojunction field-effect transistor (HFET) to reduce the peak electric field in the device, thereby increasing breakdown voltage and decreasing charge trapping. A stepped gate manufactured in the manner described in this disclosure can be designed to accommodate trade-offs between capacitance, gate charge, speed, and breakdown voltage for various power switching and/or radio frequency (RF) applications. The disclosure has been reduced to practice and combined with ohmic contact regrowth, an ultrashort gate, and enhancement-mode scaled epitaxial layers to demonstrate a high-speed switch with low on-resistance and breakdown voltage >200 V.

The fabrication method described in this disclosure allows realization of a single-metallization gate with multiple field-plate steps. The continuous stepped field-plate gate dimensions can be more easily scaled than prior art discontinuous multiple-field plate structures and should result in a more uniform electric field profile. In addition, the sacrificial-gate fabrication process described here is metal-free until after all dielectric layers have been deposited, which has the benefit of increased thermal tolerance during processing compared to prior art multiple field-plate structures.

The stepped gate field plate allows engineering of the electric field in the gate-drain region of a GaN HFET device. Through modification of the dielectric layer thicknesses and the field plate dimensions, the electric field can be engineered to maximize breakdown voltage, minimize charge trapping, and manage parasitic capacitances for optimum device performance. Prior art field-plated GaN devices utilized either a single field plate or multiple field-plates separated by supporting dielectric layers. The dimensions of the stepped field-plate gate in this disclosure are more easily scaled than in previous multiple field-plate structures, in which both the distance of the field plate from the epitaxial surface and the spacing between adjacent field-plates was defined by the thickness of the deposited dielectric layers.

In addition, this disclosure utilizes a sacrificial gate process with a single gate metallization step towards the end of the process, allowing an increased thermal budget during processing compared to prior art multiple field-plate processes. The stepped field-plate gate may be deposited by electroplating, which results in a lower-stress thicker gate than can be achieved through conventional sputtering or evaporation, which reduces gate resistance and improves reliability. Finally, the sacrificial gate process described here does not require dry etching of the dielectrics supporting the field plates, potentially reducing damage in the material and mitigating charge trapping.

FIG. 1A shows a cross-sectional schematic of a multiple stepped field-plate GaN FET in accordance with the present disclosure.

In one embodiment, the FET has a substrate 12, which may be SiC, sapphire, or GaN, a buffer layer 14, which may be AlGaN or GaN on top of the substrate 12, a channel layer 16, which may GaN or InN and which may be vertically scaled DHFET epi, on top of the buffer layer 14, and a barrier layer 18, which may be AlN or AlGaN, on top of the channel layer 16. A source 20 and a drain 22, which may be n+GaN, are in contact with the channel layer 16. An in-situ SiN layer 24 may be on top of the barrier layer 18.

A stepped field plate gate 32, which may be Au, Ti Pt, Ni or Al, is in a stepped opening in passivation layers 26, 28 and 30, which may be SiN or $SiO_2$. A Pt or Ni seed layer 34 may be between the stepped field plate 32 and the passivation layers 26, 28 and 30.

In one embodiment, the seed layer 34 may be in contact with the barrier layer 18, which is the case for a Schottky gate device. In another embodiment, as shown in FIG. 1A, the seed layer 34 may be insulated from the barrier layer 18, for example, by gate dielectric layer 36, which is the case for a metal insulated semiconductor device.

Figure 1B:
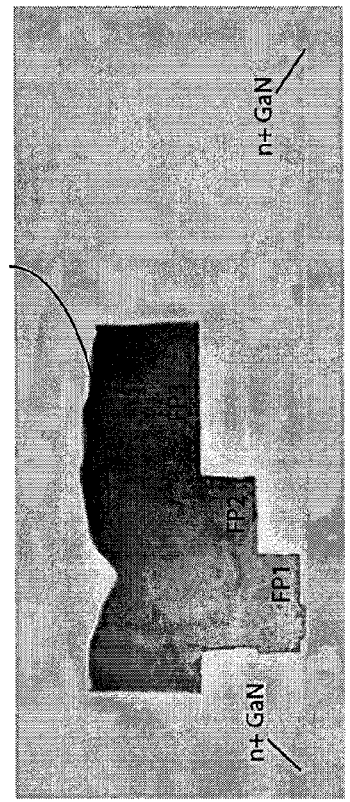
FIG. 1B shows a cross-sectional TEM image of a fabricated multiple stepped field-plate GaN FET in accordance with the present disclosure.

FIG. 1B shows a cross-sectional transmission electron microscopy (TEM) image of a multiple stepped field-plate gate GaN FET, fabricated in accordance with the disclosure. The stepped gate in FIG. 1B shows three field plates, labeled FP1, FP2, and FP3; however, there is no separation between the field plates, which are all part of one structure.

A preferred embodiment incorporates features that reduce parasitics and/or improve high-speed operation of the device, such as n+ GaN regrown ohmic contacts, a deep submicron 100 nm gate foot 40, and a vertically-scaled AlN/GaN/AlGaN DHFET epitaxial structure for providing an E-mode operation.

FIG. 2A shows a comparison of the simulated electric field intensity in an off-state at Vds=200V for a channel of a FET for a conventional single field-plate gate 42, as shown in FIG. 2B, and in the channel 16 for the stepped field-plate gate 32, as shown in FIG. 2C, each having the same overall length dimension of 1 µm. The electric field is supported across a larger area for the device with the stepped field plate gate 32. The result is a reduction in the peak field at the drain edge of the gate, which results in a desired increase in the breakdown voltage, an increased operating voltage, and a reduced dynamic on-resistance.

Figure 3:
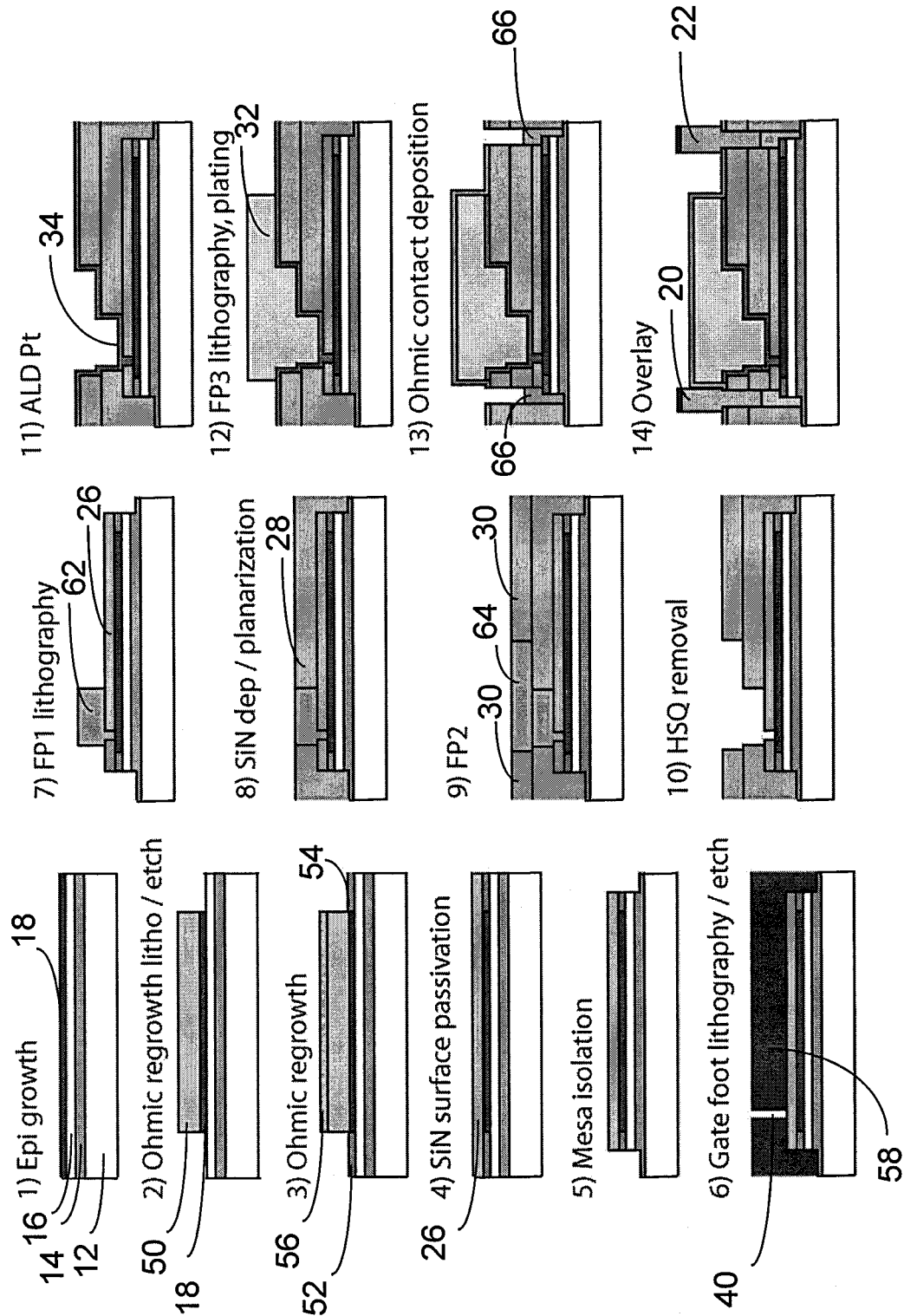
FIG. 3 shows a stepped field-plate gate fabrication process flow in accordance with the present disclosure.

FIG. 3 shows a process flow used to fabricate the stepped field-plate gate 32 of the present disclosure. In step (1) of FIG. 3 epitaxial growth for the buffer layer 14, the channel layer 16 and the barrier layer 18 on substrate 12 is performed. Then a dielectric mask layer 50 is deposited, and the top barrier layer 18 is etched using photolithography and reactive ion etching (RIE), as shown in step (2) of FIG. 3. Then in step (3) of FIG. 3, ohmic regrowth is performed by regrowing n+GaN by molecular beam epitaxy (MBE) to form low-resistance ohmic contacts 52 and 54 for the source 20 and drain 22 to the 2DEG. A polycrystalline layer 56 forms on the dielectric mask layer 50. Then the dielectric mask layer 50 is removed.

Next, in step (4) of FIG. 3, a first passivation layer 26, which may be SiN or $SiO_2$, is deposited on the barrier layer 18 and the ohmic contacts 52 and 54 by plasma-enhanced chemical vapor deposition. Then etching the first passivation layer 26, the ohmic contacts 52 and 54, the channel layer 16 and the buffer layer 18 using RIE to form a mesa for device isolation, as shown in step (5) of FIG. 3. Then resist 58 is deposited over the device and an opening is defined for a gate foot 40 in the resist 58 using electron-beam (EB) lithography and RIE, as shown in step (6) of FIG. 3. Then in step (7) of FIG. 3, a first field plate is defined using electron beam (EB) lithography and by depositing a negative EB resist 62, which may be hydrogen silsesquioxane (HSQ) is deposited. Then in step (8) of FIG. 3, a second passivation layer 28, which may be SiN or $SiO_2$, is deposited over the negative EB resist 62 and the first passivation layer 26. Then chemical-mechanical polishing (CMP) is performed to planarize the top surface of the negative EB resist 62 and the second passivation layer 28 to form a flat surface. Then as shown in step (9) of FIG. 3, a second field plate is defined using electron beam (EB) lithography and by depositing a negative EB resist 64, which may be hydrogen silsesquioxane (HSQ). Then the third passivation layer 30, which may be SiN or $SiO_2$, is deposited over the second passivation layer 28 and over the negative EB resist 64. Then chemical-mechanical polishing (CMP) is performed to planarize the top surface of the negative EB resist 64 and the second passivation layer 28 to form a flat surface. Then, as shown in step (10) of FIG. 3, the negative EB resist 62 and the negative EB resist 64 are removed by wet etching.

Next as shown in step (11) of FIG. 3, a platinum (Pt) seed layer 34 is deposited by atomic layer deposition (ALD). Then as shown in step (12) of FIG. 3, photolithography and plating are performed to form the stepped field-plate gate 32, which may include a third field plate extending over the third passivation layer 30. Then, as shown in step (13) of FIG. 3, the first, second and third passivation layers 26, 28 and 30 are etched to expose ohmic contacts 52 and 54 and ohmic contacts 66 connected to the ohmic contacts 52 and 54 are deposited. Finally, as shown in step (14) of FIG. 3, overlay metal is deposited to form the source 20 and drain 22 contacts.

As described above, in one embodiment, the seed layer 34 may be in contact with the barrier layer 18, which is the case as shown in FIG. 3 to form a Schottky gate device. In another embodiment, as shown in FIG. 1A, the seed layer 34 may be insulated from the barrier layer 18, for example, by gate dielectric layer 36, which is the case for a metal insulated semiconductor device.

Figure 4B:
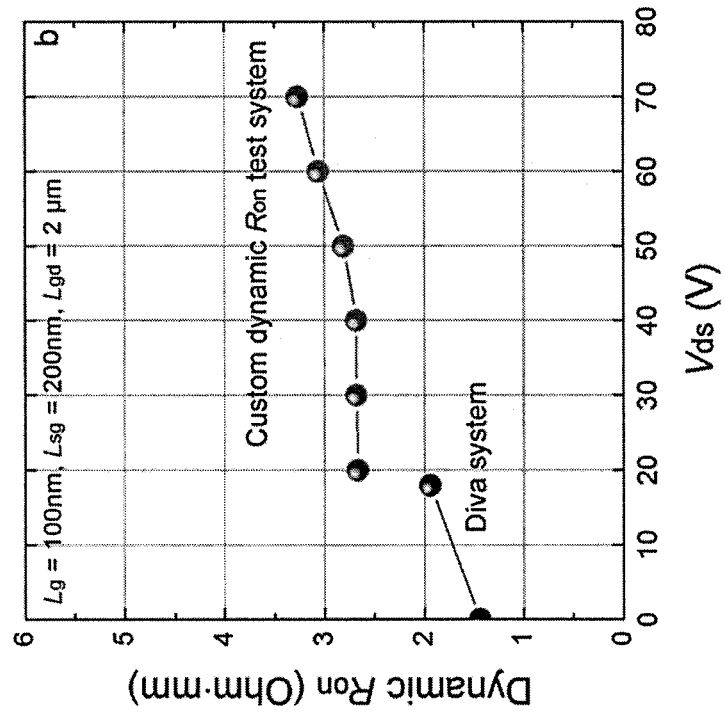
FIG. 4B shows the results for the same device measured at higher drain biases on a custom-made dynamic on-resistance test system.
Figure 4A:
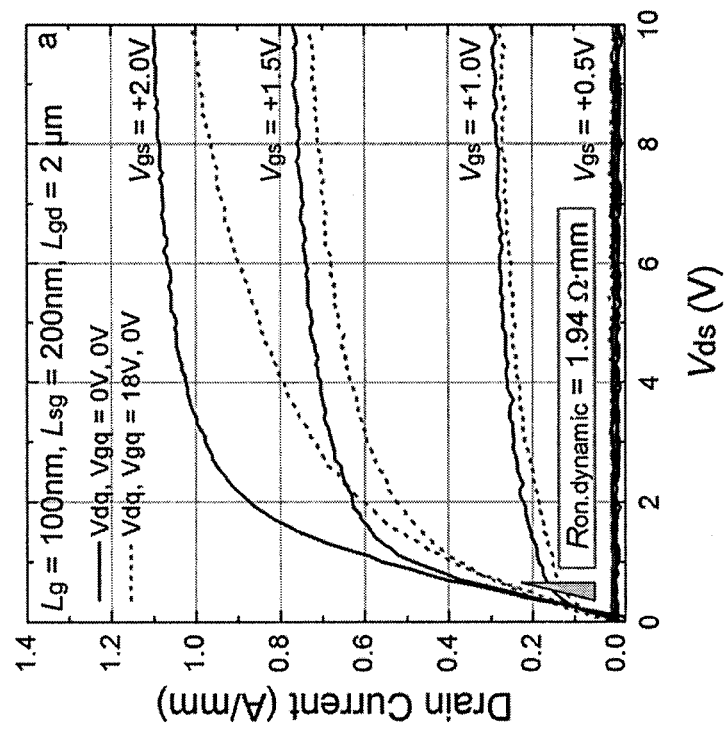
FIG. 4A shows the current voltage (IV) characteristics for a pulsed common-source measured on a Dynamic IV Analyzer (DIVA) system from a stepped field-plate FET in accordance with the present disclosure.

The stepped field-plate devices were fabricated and tested. FIG. 4A shows pulsed common-source IV characteristics measured on a Dynamic IV Analyzer (DIVA) for a stepped field-plate FET with a gate length of 100 nm, source-gate spacing of 200 nm, and gate-drain spacing of 2 um. The dynamic on-resistance measured with quiescent drain and gate biases of 18V, 0V (off-state) was 1.94 ohm-mm. The same device was also measured at higher drain biases on a custom-made dynamic on-resistance test system, as shown in FIG. 4B. The dynamic on-resistance was less than 3 ohm-mm for drain biases of up to 50V. The low measured dynamic on-resistance demonstrates the effectiveness of the stepped field-plate gate for electric field and trapping mitigation.

Figure 5:
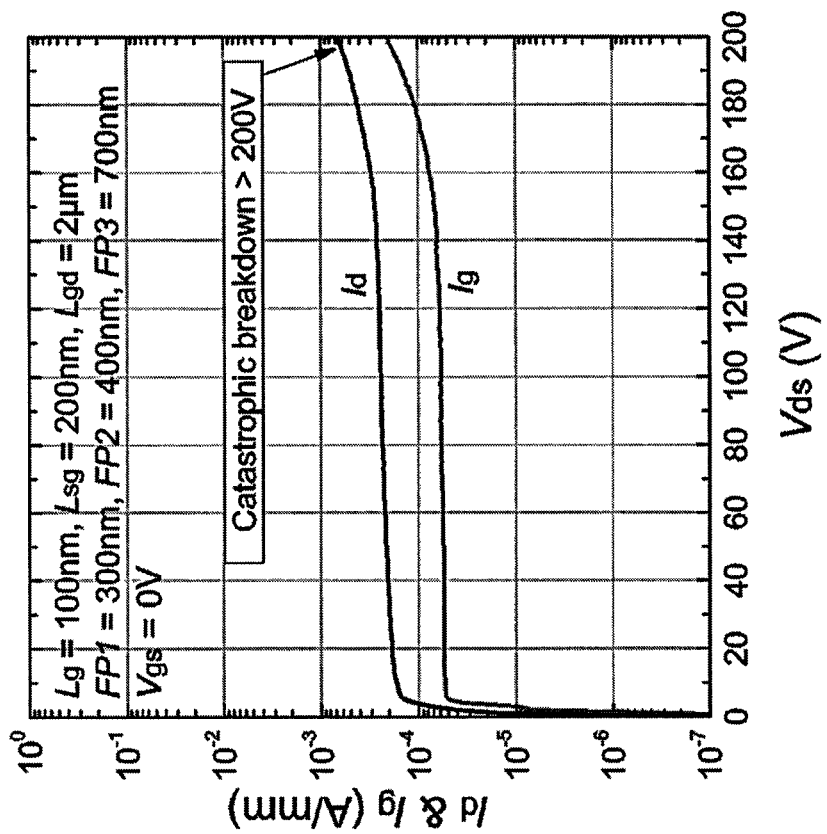
FIG. 5 shows the three-terminal breakdown characteristics of a stepped field-plate gate in accordance with the present disclosure.

FIG. 5 shows the three-terminal breakdown characteristics of a stepped field-plate gate with a gate length of 100 nm, source-gate spacing of 200 nm, and gate-drain spacing of 2 um. The catastrophic breakdown voltage was >200V, which corresponds to >100 V/um in the gate-drain region of the device. The gate and drain currents were less than $1 \times 10^{-3}$ A/mm for drain voltages of up to 200V. The high breakdown voltage demonstrates the effectiveness of the stepped field-plate gate in mitigating the peak electric field of the device.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of making a stepped field-plate gate field effect transistor comprising:
    forming a first passivation layer on a barrier layer;
    defining a first field plate by using electron beam lithography and by depositing a first negative electron beam resist;
    forming a second passivation layer over the first negative electron beam resist and the first passivation layer;
    planarizing the first negative electron beam resist and the second passivation layer;
    defining a second field plate by using electron beam lithography and by depositing a second negative electron beam resist, the second negative electron beam resist connected to the first negative electron beam resist;
    forming a third passivation layer over the second negative electron beam resist and the second passivation layer;
    planarizing the second negative electron beam resist and the third passivation layer;
    removing the first negative electron beam resist and the second negative electron beam resist; and
    forming a stepped field gate by using lithography and plating, the stepped field gate having the first and second field plates filling a void left by the removed first and second negative electron beam resists and having a third field plate connected to the second field plate and extending over the third passivation layer;
    wherein the first, second, and third field plates are one structure.

2. The method of claim 1 further comprising:
    depositing a seed layer by atomic layer deposition (ALD) before forming the stepped field gate.

3. The method of claim 1 further comprising:
    depositing resist on the first passivation layer and forming an opening in the resist to define a gate foot.

4. The method of claim 1 further comprising:
    growing a buffer layer on a substrate, a channel layer on the buffer layer, and the barrier layer on the channel layer;
    forming first and second ohmic contacts to the channel layer for a source and a drain;
    forming the first passivation layer on the barrier layer and the ohmic contacts;
    etching portions of the first passivation layer, the first and second ohmic contacts, the channel layer and the buffer layer to form a mesa for device isolation;
    etching the first, second and third passivation layers to expose the first and second ohmic contacts and depositing a third ohmic contact on the first ohmic contact, and a fourth ohmic contact on the second ohmic contact; and
    depositing an overlay metal on the third and fourth contacts to form a source and a drain contact, respectively.

5. The method of claim 1 wherein the first passivation layer, the second passivation layer, and the third passivation layer comprise SiN or $SiO_2$.

6. The method of claim 1 wherein the first negative electron beam resist and the second negative electron beam resist comprise hydrogen silsesquioxane (HSQ).

7. The method of claim 1 wherein the step of planarizing the first negative electron beam resist and the second passivation layer and the step of planarizing the second negative electron beam resist and the third passivation layer comprise chemical-mechanical polishing (CMP).

8. The method of claim 4 wherein the step of forming first and second ohmic contacts to the channel layer for the source and the drain comprises:
    depositing a dielectric mask layer on the barrier layer;
    etching exposed portions of the barrier layer using reactive ion etching (RIE);
    growing n+ GaN by molecular beam epitaxy (MBE) to form low-resistance ohmic contacts for the source and the drain.

9. The method of claim 1 wherein removing the first negative electron beam resist and the second negative electron beam resist comprises wet etching.

10. The method of claim 2 wherein a portion of the seed layer is formed to be in contact with the barrier layer to form a Schottky gate device.

11. The method of claim 2 wherein the seed layer is insulated from the barrier layer.

12. The method of claim 2 wherein the stepped field gate comprises Au, Ti Pt, Ni or Al.

13. The method of claim 2 wherein the seed layer comprises Pt or Ni.

14. A method of making a stepped field-plate gate field effect transistor comprising:
    growing a buffer layer on a substrate, a channel layer on the buffer layer, and a barrier layer on the channel layer;
    forming first and second ohmic contacts to the channel layer for a source and a drain;
    forming a first passivation layer on the barrier layer and the ohmic contacts;
    etching portions of the first passivation layer, the first and second ohmic contacts, the channel layer and the buffer layer to form a mesa for device isolation;
    depositing resist and forming an opening in the resist to define a gate foot;
    defining a first field plate in the resist by using electron beam lithography and by depositing a first negative electron beam resist;

forming a second passivation layer over the first negative electron beam resist and the first passivation layer;

planarizing the first negative electron beam resist and the second passivation layer;

defining a second field plate by using electron beam lithography and by depositing a second negative electron beam resist, the second negative electron beam resist connected to the first negative electron beam resist;

forming a third passivation layer over the second negative electron beam resist and the second passivation layer;

planarizing the second negative electron beam resist and the third passivation layer;

removing the first negative electron beam resist and the second negative electron beam resist;

depositing a seed layer by atomic layer deposition (ALD);

forming a stepped field gate by using lithography and plating, the stepped field gate having the first and second field plates filling in a void left by the removed first and second negative electron beam resists and having a third field plate connected to the second field plate and extending over the third passivation layer;

etching the first, second and third passivation layers to expose the first and second ohmic contacts and depositing a third ohmic contact on the first ohmic contact, and a fourth ohmic contact on the second ohmic contact; and depositing an overlay metal on the third and fourth contacts to form a source contact and a drain contact, respectively.

15. A method of making a stepped field-plate gate field effect transistor comprising:

forming a first passivation layer on a barrier layer;

defining a first field plate by using lithography and by depositing a first resist;

forming a second passivation layer over the first resist and the first passivation layer;

planarizing the first resist and the second passivation layer;

defining a second field plate by using lithography and by depositing a second resist, the second resist connected to the first resist;

forming a third passivation layer over the second resist and the second passivation layer;

planarizing the second resist and the third passivation layer;

removing the first and second resists; and forming a stepped field gate by using lithography and plating, the stepped field gate having the first and second field plates filling a void left by the removed first and second resists and having a third field plate connected to the second field plate and extending over the third passivation layer;

wherein the first, second, and third field plates are one structure.

* * * * *